(12) United States Patent
Lee et al.

(10) Patent No.: US 9,161,457 B2
(45) Date of Patent: Oct. 13, 2015

(54) APPARATUS FOR MANUFACTURING CAMERA MODULE

(71) Applicant: SAMSUNG ELECTRO-MECHANICS CO., LTD., Suwon (KR)

(72) Inventors: Sung Jae Lee, Suwon (KR); Byung Jae Kim, Suwon (KR); Sang Jin Kim, Suwon (KR); Soo Gil Shin, Suwon (KR); Seung Hee Cho, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 175 days.

(21) Appl. No.: 13/827,488

(22) Filed: Mar. 14, 2013

(65) Prior Publication Data

US 2013/0333207 A1   Dec. 19, 2013

(30) Foreign Application Priority Data

Jun. 18, 2012 (KR) .......................... 10-2012-0064940

(51) Int. Cl.
*H05K 3/30* (2006.01)
*H04N 5/225* (2006.01)

(52) U.S. Cl.
CPC ............... *H05K 3/30* (2013.01); *H04N 5/2253* (2013.01); *H04N 5/2254* (2013.01); *H05K 3/305* (2013.01); *H05K 2201/09036* (2013.01); *H05K 2201/09045* (2013.01); *H05K 2201/10121* (2013.01);
(Continued)

(58) Field of Classification Search
CPC . B23K 1/018; H01L 21/67259; H01L 21/681
USPC ......... 29/729, 739–743, 832–834; 156/273.9, 156/538, 60; 272/6; 228/121.21–121.22
See application file for complete search history.

(56) References Cited

U.S. PATENT DOCUMENTS

| | | | |
|---|---|---|---|
| 6,435,401 B1 * | 8/2002 | Miitsu et al. | 228/264 |
| 7,279,358 B2 * | 10/2007 | Yamauchi et al. | 438/108 |
| 7,707,712 B2 * | 5/2010 | Kim | 29/832 |

(Continued)

FOREIGN PATENT DOCUMENTS

| | | |
|---|---|---|
| JP | 10-321825 | 12/1998 |
| JP | 2001-244280 | 9/2001 |

(Continued)

OTHER PUBLICATIONS

Korean Notice of Allowance mailed Aug. 21, 2013 in corresponding Korean Application No. 10-2012-0064940.
Japanese Office Action issued Apr. 1, 2014 in corresponding Japanese Patent Application No. 2013-103250.

*Primary Examiner* — Minh Trinh
(74) *Attorney, Agent, or Firm* — NSIP Law (57) ABSTRACT

Disclosed herein is an apparatus for manufacturing a camera module, the apparatus including: a base jig holding a PCB from below; a bonding head picking up an image sensor and attaching the image sensor onto the PCB; and a housing bonding tool picking up a housing assembly and attaching the housing assembly onto the PCB so that the image sensor attached onto the PCB is received in the housing assembly, wherein the base jig is constituted in a structure where the base jig is tension-movable in a vertical direction (Z-axial direction), so that an upper surface of the PCB is an identical reference plane for attaching the image sensor and the housing assembly when the image sensor is picked up by the bonding head and attached onto the PCB.

5 Claims, 9 Drawing Sheets

(52) U.S. Cl.
CPC ............... *H05K2201/10151* (2013.01); *H05K 2203/0165* (2013.01); *Y10T 29/53174* (2015.01)

(56) References Cited

U.S. PATENT DOCUMENTS

| | | | | |
|---|---|---|---|---|
| 8,422,005 | B2 * | 4/2013 | Borchard et al. | 356/127 |
| 2005/0028840 | A1 * | 2/2005 | Lee et al. | 134/18 |
| 2009/0129412 | A1 * | 5/2009 | Kim | 372/6 |
| 2009/0251699 | A1 * | 10/2009 | George | 356/401 |
| 2013/0299081 | A1 * | 11/2013 | Kim et al. | 156/273.9 |
| 2013/0333207 | A1 * | 12/2013 | Lee et al. | 29/739 |

FOREIGN PATENT DOCUMENTS

| | | | |
|---|---|---|---|
| JP | 2007-294793 | * | 8/2007 |
| KR | 10-2008-0016071 | | 2/2008 |
| KR | 10-2008-0032507 | | 4/2008 |
| KR | 10-2009-0047307 | | 5/2009 |
| KR | 10-2009-0105587 | | 10/2009 |
| KR | 10-2010-0013908 | | 2/2010 |
| KR | 10-2010-0102961 | | 9/2010 |
| KR | 10-2011-0085137 | | 7/2011 |

* cited by examiner

[FIG. 1A]

- PRIOR ART -

[FIG. 1B]

- PRIOR ART -

APPARATUS FOR MANUFACTURING CAMERA MODULE

CROSS REFERENCE(S) TO RELATED APPLICATIONS

This application claims the benefit under 35 U.S.C. Section 119 of Korean Patent Application Serial No. 10-2012-0064940, entitled "Apparatus for Manufacturing Camera Module" filed on Jun. 18, 2012, which is hereby incorporated by reference in its entirety into this application.

BACKGROUND OF THE INVENTION

1. Technical Field

The present invention relates to an apparatus for manufacturing a camera module, and more particularly to an apparatus for manufacturing a camera module, capable of solving the tilt problem that may be generated in a die attach (D/A) process by improving a structure of a base jig holding a PCB.

2. Description of the Related Art

A chip on board (COB) method is most frequently and widely used in manufacturing a camera module. This COB method is largely composed of a dicing (wafer sawing) process, a D/A (die attach) process, a W/B (wire bonding) process, and an H/A (housing attach) process, and the respective processes will be described as follows.

Dicing Process: Image sensors on a bare wafer are attached and fixed on a tape of a wafer ring, and a specific position of a pattern is moved in X and Y directions while a blade made of diamond particles is rotated at a high speed, to thereby separate the image sensors from each other.

D/A Process: An epoxy is applied on a PCB, and then the image sensors respectively separated in the dicing process are repeatedly attached onto predetermined positions of the PCB and cured while a specific position pattern formed on the PCB is image-recognized.

W/B process: The image sensors and the PCB are electrically connected by connecting between pads of the image sensors and patterns of the PCB with gold wires using a capillary.

H/A Process: The epoxy is applied at an edge of the PCB on which the image sensors are mounted, and then housing modules with lenses are repeatedly attached to predetermined positions and cured.

Meanwhile, in manufacturing a camera module through the above processes, high-pixel modules having even twelve mega pixels have been developed. Also, the number of pixels of the module is expected to continuously increase in the years ahead. The resolution problem is one of the problems caused by rapidly increasing the number of pixels.

Figure 1A:
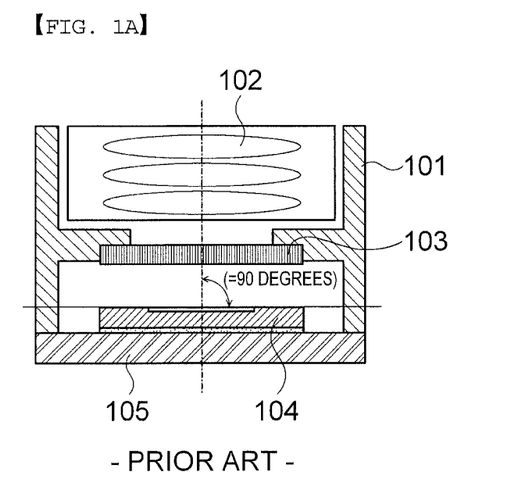
FIGS. 1A and 1B are views schematically explaining that the resolution is degraded due to the tilt of an image sensor, in a manufacturing process of a camera module.
Figure 1B:
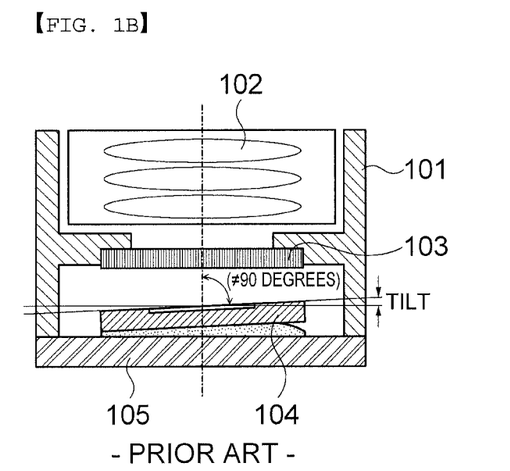

As shown in FIG. 1A, the most idealistic resolution is obtained when the central optical axis of lenses 102 makes an angle of 90° with respect to a surface of an image sensor 104 receiving the light. However, as shown in FIG. 1B, when the optical axis of the lenses 102 does not make an angle of 90° with the image sensor 104 due to tilting of the image sensor 104, the resolution at a specific edge of an image may be degraded, resulting in degrading the resolution of the overall image. In FIGS. 1A and 1B, reference number 101 indicates a housing assembly, 103 indicates an infrared (IR) filter, and 105 indicates a PCB.

As such, the tilting of the image sensor 104 causing degradation of the resolution may be complexly generated during a package process, due to combination between the lenses 102 themselves, flatness of the PCB 105, the tilt in assembling an auto-focusing actuator, or the like.

RELATED ART DOCUMENTS

Patent Documents (Patent Document 1) Korean Patent Laid-Open Publication No. 10-2009-0105587
(Patent Document 2) Korean Patent Laid-Open Publication No. 10-2009-0047307

SUMMARY OF THE INVENTION

An object of the present invention is to provide an apparatus for manufacturing a camera module, capable of solving the tilt problem that may be generated in a die attach (D/A) process, by changing a structure of a base jig holding a PCB such that the base jig is tension-movable in a vertical direction.

According to an exemplary embodiment of the present invention, there is provided an apparatus for manufacturing a camera module, the apparatus including: a base jig holding a PCB from below; a bonding head picking up an image sensor and attaching the image sensor onto the PCB; and a housing bonding tool picking up a housing assembly and attaching the housing assembly onto the PCB so that the image sensor attached onto the PCB is received in the housing assembly, wherein the base jig is constituted in a structure where the base jig is tension-movable in a vertical direction (Z-axial direction), so that an upper surface of the PCB is an identical reference plane for attaching the image sensor and the housing assembly when the image sensor is picked up by the bonding head and attached onto the PCB.

The base jig may be composed of one pair of base jig parts that is opened more widely than the size of the PCB, and a heat-resistant tape formed all over upper surfaces of the pair of base jig parts, the base jig being constituted as a tape self-alignment jig that aligns a tilt by using the tension of the heat-resistant tape.

The base jig may be constituted as a silicon tape alignment jig that aligns a tilt by using the tension of a silicon tape, by installing the silicon tape on an upper surface of the base jig.

The base jig may be constituted as a center gyro jig that aligns a tilt by using a gyro ball, by inserting the gyro ball into a central part of the base jig to thereby allow the base jig to perform a gyro function.

The base jig may be constituted as a 4-ball pin jig that aligns a tilt by using the tension of four ball pins, by installing the four ball pins, which are tension-movable in a vertical direction (Z-axial direction), in a square shape on the base jig.

The base jig may be constituted as a flat spring tension jig that aligns a tilt by using the tension of a flat spring part, by extending the flat spring part from one side of the base jig.

DESCRIPTION OF THE PREFERRED EMBODIMENTS

Terms and words used in the present specification and claims are not to be construed as a general or dictionary meaning but are to be construed as meaning and concepts meeting the technical ideas of the present invention based on a principle that the inventors can appropriately define the concepts of terms in order to describe their own inventions in the best mode.

Through the specification, unless explicitly described to the contrary, the word "comprise" and variations such as "comprises" or "comprising", will be understood to imply the inclusion of stated elements but not the exclusion of any other elements. In addition, the terms "-er", "-or", "module", and "unit" described in the specification mean units for processing at least one function and operation, and can be implemented by hardware components or software components and combinations thereof.

Exemplary embodiments of the present invention will now be described in detail with reference to the accompanying drawings.

Here, prior to the explanation of exemplary embodiments of the present invention, the reason why the tilt is generated in a general manufacturing process of the camera module and the types thereof will be first described for better understanding.

According to the die attach (D/A) process in the manufacturing process of the camera module, as described above, a predetermined amount of epoxy is applied on a flat PCB in the predetermined shape, and then the image sensors respectively separated after completion of dicing are picked up and mounted onto predetermined positions of the PCB while a pattern formed on the PCB is image-recognized.

Figure 2:
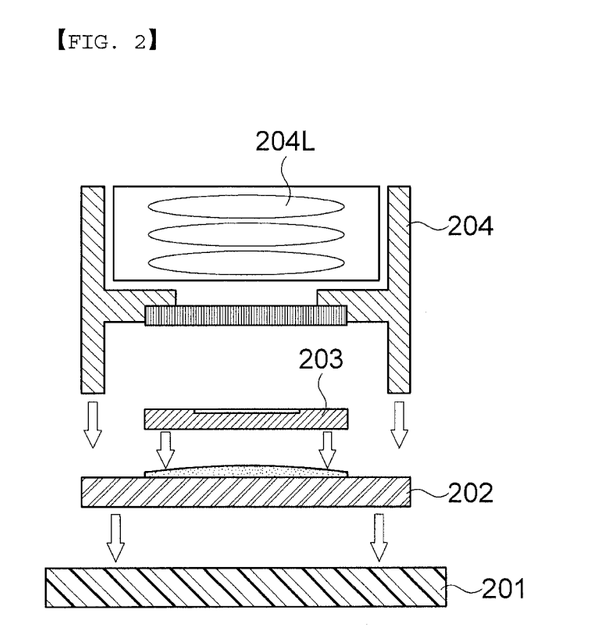
FIG. 2 is a view showing a procedure of manufacturing a camera module by a die attach (D/A) method.

In the die attach (D/A) process of the related art, as shown in FIG. 2, a PCB 202 is stacked on a base jig 201 while a bottom surface of the PCB 202 is a reference plane based on an upper surface of the base jig 201 inside a machine. Then, an image sensor 203 is attached thereon, and finally, an autofocus actuator 204 (that is, a housing assembly including a lens module) is fitted thereon.

However, in the manufacturing process of the camera module as above, the important factor that determines the image resolution of the camera is horizontality between the image sensor 203 and a lens (204L) (that is to say, verticality between a central optical axis of the lens and a surface of the image sensor). There are many factors that degrade the horizontality between the image sensor 203 and the lens 204L, but the following factors are representative.

Figure 3A:
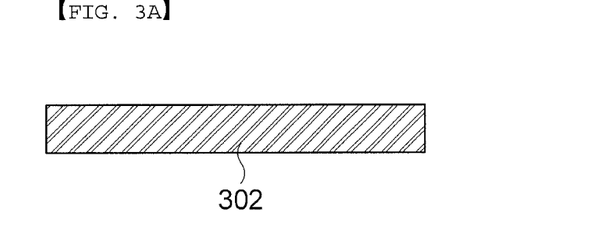
FIGS. 3A to 3C are views explaining that a tilt occurs when an image sensor is attached onto a PCB, due to flatness and warpage of a PCB, in a manufacturing process of a camera module by a die attach (D/A) method.
Figure 3B:
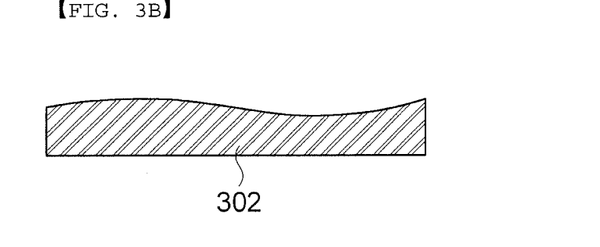
Figure 3C:
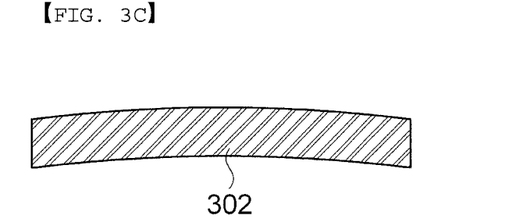

First, the tilt occurs when a surface of a PCB 302 is not flat, as shown in FIG. 3B, or the tilt occurs due to warpage of the PCB 302 when an image sensor is attached on the PCB 302, as shown in FIG. 3C.

Figure 4A:
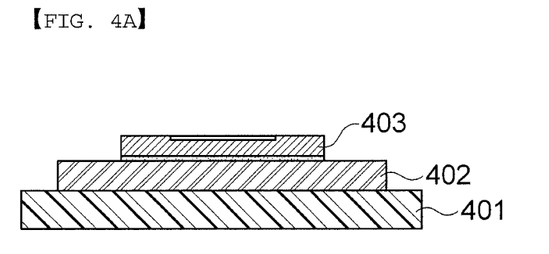
FIGS. 4A and 4B are views explaining that a tilt occurs between an image sensor and a housing since a reference plane for attaching the image sensor is different from a reference plane for attaching the housing, in a manufacturing process of a camera module by a die attach (D/A) method.
Figure 4B:
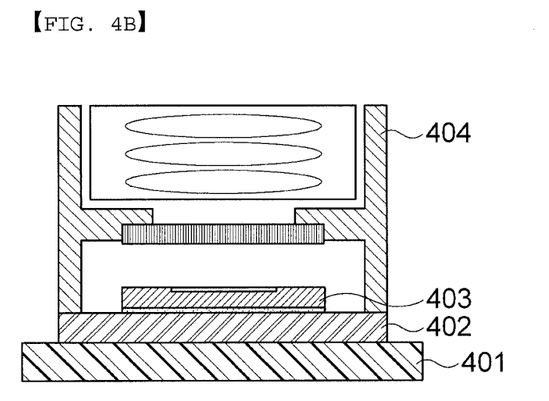

Meanwhile, a lower surface of the PCB 402 is a reference plane at the time of attachment of an image sensor 403 as shown in FIG. 4A, whereas an upper surface of a PCB 402 is a reference plane at the time of attachment of a housing 404 as shown in FIG. 4B. Therefore, the reference plane at the time of attachment of the image sensor 403 and the reference plane at the time of attachment of the housing 404 are different from each other, and thus, the tilt occurs between the image sensor 403 and the housing 404.

Figure 5A:
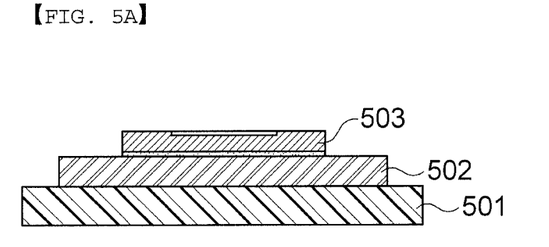
FIGS. 5A and 5B are views explaining that a tilt occurs between a PCB and an image sensor due to a non-horizontal state of a base jig, in a manufacturing process of a camera module by a die attach (D/A) method.
Figure 5B:
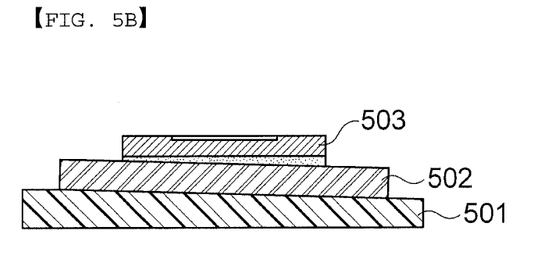

In addition, as shown in FIG. 5B, since a base jig 501 (that is, an upper surface of the base jig 501) does not make a horizontal state, a tilt occurs in a PCB 502 and an image sensor 503 attached thereon.

Figure 6A:
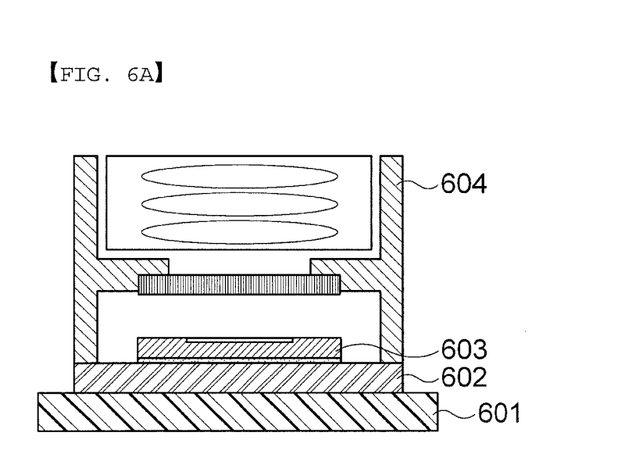
FIGS. 6A and 6B are views explaining that a tilt occurs between a housing (lens) and an image sensor due to a defect in precision of housing attachment, in a manufacturing process of a camera module by a die attach (D/A) method.
Figure 6B:
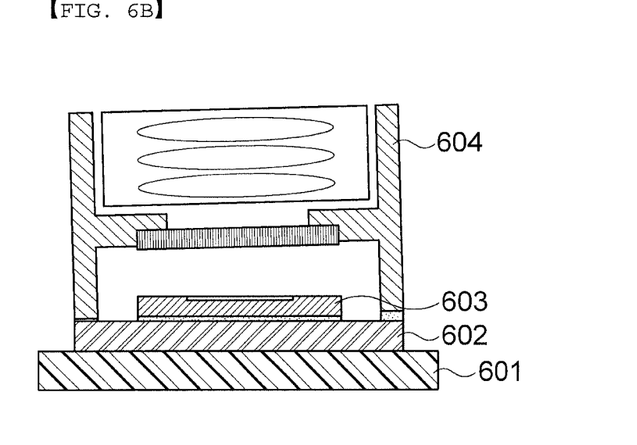

In addition, as shown in FIG. 6B, when a housing 604 is attached onto a PCB 602, the precision in attachment of the housing is deteriorated, and thus, a tilt occurs between the housing 604 (that is, lenses fitted inside the housing 604) and the image sensor 603.

The present invention is made considering the factors of tilt as described above, and thus, there is provided an apparatus for manufacturing a camera module, capable of solving the tilt problem that may be generated in a die attach (D/A) process, by changing a structure of a base jig holding a PCB such that the base jig is tension-movable in a vertical direction (Z-axial direction).

Figure 7:
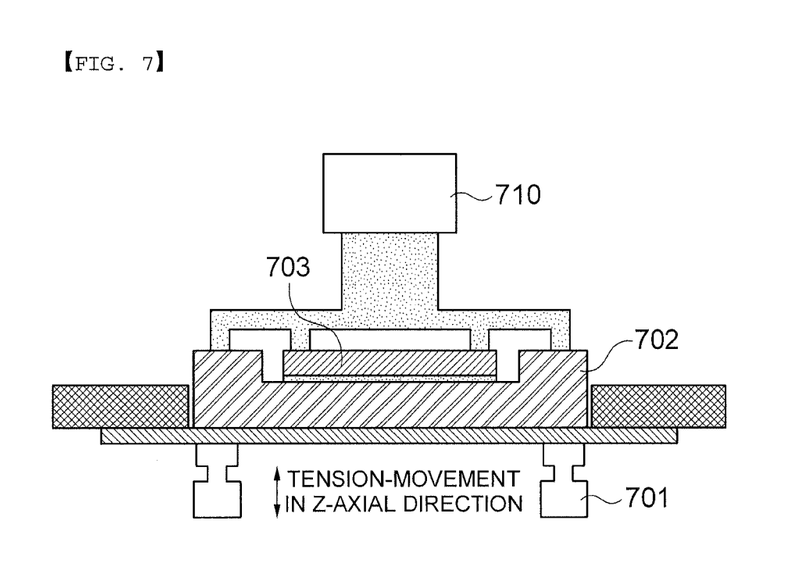
FIG. 7 is a view conceptually showing that a base jig is constituted in a structure where the base jig is tension-movable in a vertical direction (Z-axial direction), in an apparatus for manufacturing a camera module according to an exemplary embodiment of the present invention.

FIG. 7 is a view conceptually showing that a base jig is constituted in a structure where the base jig is tension-movable in a vertical direction (Z-axial direction), in an apparatus for manufacturing a camera module according to an exemplary embodiment of the present invention.

Referring to FIG. 7, an apparatus for manufacturing a camera module according to the present invention may include a base jig 701 holding a PCB 702 from below; a bonding head 710 picking up an image sensor 703 and attaching the image sensor 703 on the PCB 702; and a housing bonding tool (not shown) picking up a housing assembly (housing) 604 (see, FIGS. 6A and 6B) and attaching the housing assembly on the PCB 702 such that the image sensor 703 attached on the PCB 702 is contained inside the housing assembly.

Particularly, the base jig 701 is constituted in a structure where the base jig 701 is tension-movable in a vertical direction (Z-axial direction) so that an upper surface of the PCB 702 is the identical reference plane for attaching the image sensor 703 and the housing assembly 604 when the image sensor 703 is picked up by the bonding head 710 and attached onto the PCB 702.

Figure 8:
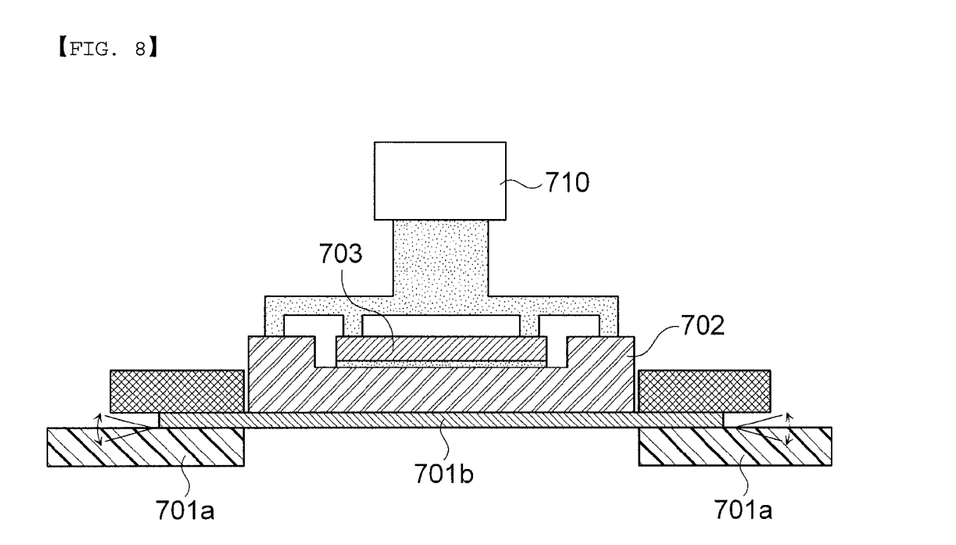
FIG. 8 is a view showing a first example of a base jig, in an apparatus for manufacturing a camera module according to the present invention.

Here, as shown in FIG. 8, the base jig 701 may be composed of one pair of base jig parts 701a that is opened more widely than the size of the PCB 702 (for example, opened more widely than the size of the PCB by 120%), and a heat-resistant tape 701b formed all over upper surfaces of the pair of base jig parts 710a. Here, the base jig 701 may be constituted as a tape self-alignment jig that aligns a tilt by using the tension of the heat-resistant tape 701b.

Figure 9:
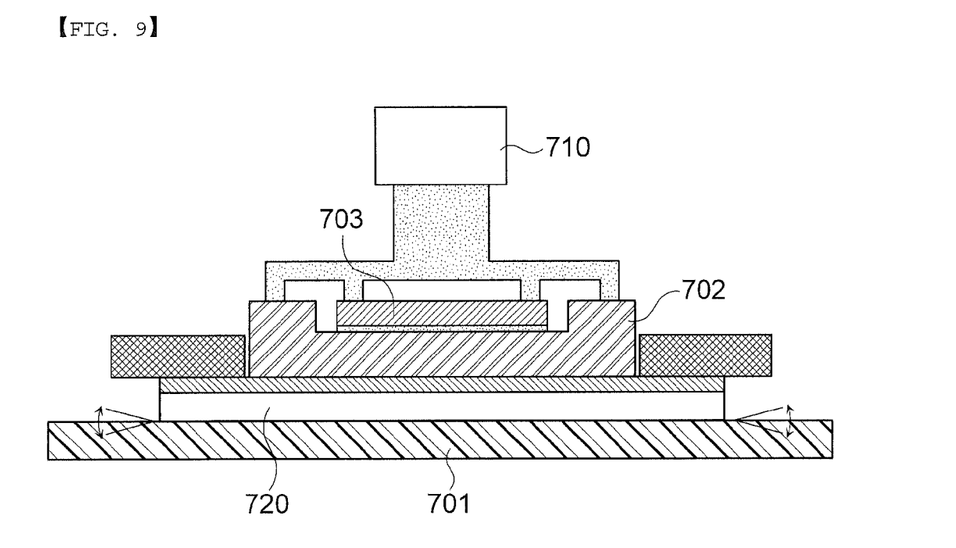
FIG. 9 is a view showing a second example of a base jig, in an apparatus for manufacturing a camera module according to the present invention.

Alternatively, as shown in FIG. 9, the base jig 701 may be constituted as a silicon tape alignment jig that aligns a tilt by using the tension of a silicon tape 720, by forming the silicon tape 720 on the upper surface of the base jig 701.

Figure 10:
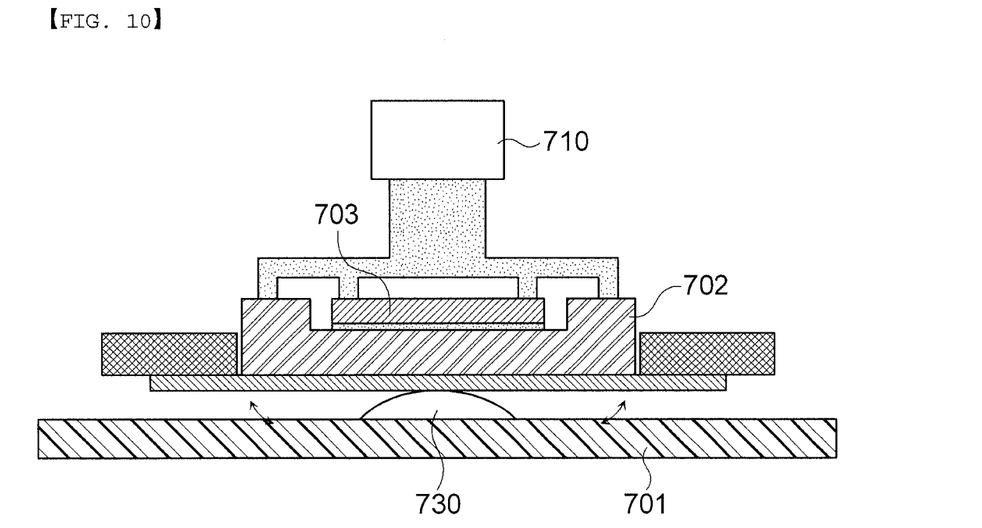
FIG. 10 is a view showing a third example of a base jig, in an apparatus for manufacturing a camera module according to the present invention.

Alternatively, as shown in FIG. 10, the base jig 701 may be constituted as a center gyro jig that aligns a tilt by using a gyro ball 730, by inserting the gyro ball 730 into a central part of the base jig 701 to thereby allow the base jig 701 to perform a gyro function.

Figure 11:
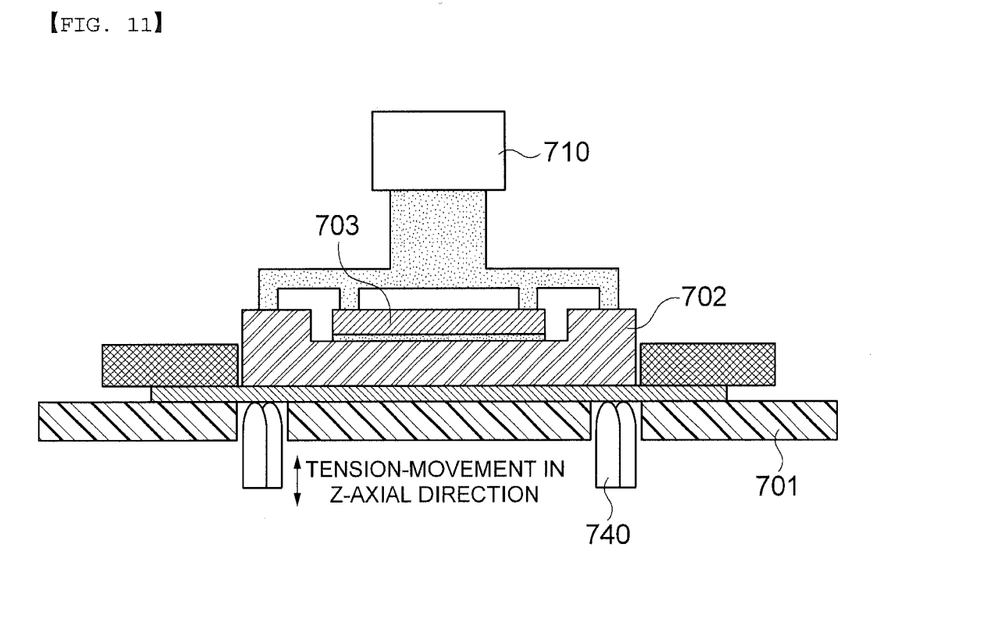
FIG. 11 is a view showing a fourth example of a base jig, in an apparatus for manufacturing a camera module according to the present invention.

Alternatively, as shown in FIG. 11, the base jig 701 may be constituted as a 4-ball pin jig that aligns a tilt by using the tension of four ball pins 740, by installing the four ball pins 740, which are tension-movable in a vertical direction (Z-axial direction), in a square shape on the base jig 701.

Figure 12:
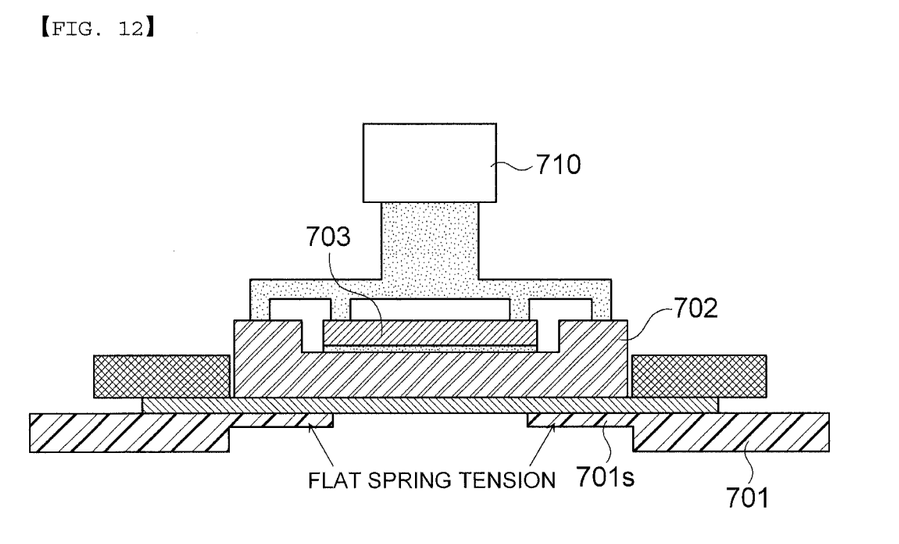
FIG. 12 is a view showing a fifth example of a base jig, in an apparatus for manufacturing a camera module according to the present invention.

Alternatively, as shown in FIG. 12, the base jig 701 may be constituted as a flat spring tension jig that aligns a tilt by using the tension of a flat spring part 701s, by extending the flat spring 701s from one side of the base jig 701.

As described above, in the apparatus for manufacturing a camera module according to the present invention, the base jig holding the PCB is constituted in a structure where the base jig is tension-movable in a vertical direction (Z-axial direction), so that the upper surface of the PCB is the identical reference plane for attaching the image sensor and the housing assembly when the image sensor is picked up by the bonding head and attached onto the PCB. Hence, the present invention can prevent the degradation in resolution due to the tilt of the image sensor as described in the related art, and reduce related costs for repairing/managing the camera module. In addition, the present invention can obtain effects of substitution for an alignment adjusting process, improvement in productivity thereby, and reduction in investment costs.

As set forth above, according to the present invention, the base jig holding the PCB is constituted in a structure where the base jig is tension-movable in a vertical direction (Z-axial direction), so that the upper surface of the PCB is the identical reference plane for attaching the image sensor and the housing assembly when the image sensor is picked up by the bonding head and attached onto the PCB. Hence, the present invention can prevent the degradation in resolution due to the tilt of the image sensor as described in the related art, and reduce related costs for repairing/managing the camera module. Further, the present invention can obtain effects of substitution for an alignment adjusting process, improvement in productivity due to the above, and reduction in investment costs.

Although the exemplary embodiments of the present invention have been disclosed for illustrative purposes, the present invention is not limited thereto, and it will be appreciated to those skilled in the art that various modifications, additions and substitutions are possible, without departing from the scope and spirit of the invention as disclosed in the accompanying claims. Therefore, the protection scope of the present invention must be construed by the following claims and it should be construed that all spirit within a scope equivalent thereto are included in the scope of the present invention.

What is claimed is:

1. An apparatus for manufacturing a camera module, the apparatus comprising:
   a base jig disposed at a lower part of a PCB to hold the lower part of the PCB;
   a bonding head picking up an image sensor and attaching the image sensor onto the PCB; and
   a housing bonding tool picking up a housing assembly and attaching the housing assembly onto the PCB so that the image sensor attached onto the PCB is received in the housing assembly,
   wherein the base jig is tension-movable in a vertical direction, as in Z-axial direction in the lower part of the PCB, so that an upper surface of the PCB is an identical reference plane for attaching the image sensor and the housing assembly when the image sensor is picked up by the bonding head and attached onto the PCB, and
   wherein the base jig is composed of one pair of base jig parts that is opened more widely than the size of the PCB, and a heat-resistant tape formed all over upper surfaces of the pair of base jig parts, the base jig aligning a tilt by using the tension of the heat-resistant tape.

2. An apparatus for manufacturing a camera module, the apparatus comprising:
   a base jig disposed at a lower part of a PCB to hold the lower part of the PCB;
   a bonding head picking up an image sensor and attaching the image sensor onto the PCB; and
   a housing bonding tool picking up a housing assembly and attaching the housing assembly onto the PCB so that the image sensor attached onto the PCB is received in the housing assembly,
   wherein the base jig is tension-movable in a vertical direction, as in Z-axial direction in the lower part of the PCB, so that an upper surface of the PCB is an identical reference plane for attaching the image sensor and the housing assembly when the image sensor is picked up by the bonding head and attached onto the PCB, and
   wherein the base jig aligns a tilt by using the tension of a silicon tape, by installing the silicon tape on an upper surface of the base jig.

3. An apparatus for manufacturing a camera module, the apparatus comprising:
   a base jig disposed at a lower part of a PCB to hold the lower part of the PCB;
   a bonding head picking up an image sensor and attaching the image sensor onto the PCB; and
   a housing bonding tool picking up a housing assembly and attaching the housing assembly onto the PCB so that the image sensor attached onto the PCB is received in the housing assembly,
   wherein the base jig is tension-movable in a vertical direction, as in Z-axial direction in the lower part of the PCB, so that an upper surface of the PCB is an identical reference plane for attaching the image sensor and the housing assembly when the image sensor is picked up by the bonding head and attached onto the PCB, and
   wherein the base jig aligns a tilt by using a gyro ball, by inserting the gyro ball into a central part of the base jig to thereby allow the base jig to perform a gyro function.

4. An apparatus for manufacturing a camera module, the apparatus comprising:
   a base jig disposed at a lower part of a PCB to hold the lower part of the PCB;
   a bonding head picking up an image sensor and attaching the image sensor onto the PCB; and a housing bonding tool picking up a housing assembly and attaching the housing assembly onto the PCB so that the image sensor attached onto the PCB is received in the housing assembly, wherein the base jig is tension-movable in a vertical direction, as in Z-axial direction in the lower part of the PCB, so that an upper surface of the PCB is an identical reference plane for attaching the image sensor and the housing assembly when the image sensor is picked up by the bonding head and attached onto the PCB, and wherein the base jig aligns a tilt by using the tension of four ball pins, by installing the four ball pins, which are tension-movable in the vertical direction, in a square shape on the base jig.

5. An apparatus for manufacturing a camera module, the apparatus comprising:

a base jig disposed at a lower part of a PCB to hold the lower part of the PCB;

a bonding head picking up an image sensor and attaching the image sensor onto the PCB; and a housing bonding tool picking up a housing assembly and attaching the housing assembly onto the PCB so that the image sensor attached onto the PCB is received in the housing assembly, wherein the base jig is tension-movable in a vertical direction, as in Z-axial direction in the lower part of the PCB, so that an upper surface of the PCB is an identical reference plane for attaching the image sensor and the housing assembly when the image sensor is picked up by the bonding head and attached onto the PCB, and wherein the base jig aligns a tilt by using the tension of a flat spring part, by extending the flat spring part from one side of the base jig.

* * * * *